United States Patent
Hiraoka

(10) Patent No.: US 11,177,808 B2
(45) Date of Patent: Nov. 16, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Takayuki Hiraoka, Kawasaki Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 0 days.

(21) Appl. No.: 17/016,716

(22) Filed: Sep. 10, 2020

(65) Prior Publication Data
US 2021/0288646 A1    Sep. 16, 2021

(30) Foreign Application Priority Data
Mar. 10, 2020    (JP) .............................. JP2020-040768

(51) Int. Cl.
*H03K 19/0185*    (2006.01)
*H03K 3/037*    (2006.01)

(52) U.S. Cl.
CPC ... *H03K 19/018507* (2013.01); *H03K 3/0375* (2013.01); *H03K 19/0185* (2013.01)

(58) Field of Classification Search
CPC ......... H03K 19/018507; H03K 3/0375; H03K 19/0185; H03K 19/018514; H03K 19/018521; H03K 19/018528
See application file for complete search history.

(56) References Cited

U.S. PATENT DOCUMENTS

| | | | |
|---|---|---|---|
| 6,466,054 B2 | 10/2002 | Kameyama et al. | |
| 9,564,901 B1* | 2/2017 | Chow | .............. H03K 19/01855 |
| 2011/0175664 A1 | 7/2011 | Inoue et al. | |

FOREIGN PATENT DOCUMENTS

| JP | 2002-135106 A | 5/2002 |
|---|---|---|
| JP | 2011-146549 A | 7/2011 |
| JP | 2011-217134 A | 10/2011 |

* cited by examiner

*Primary Examiner* — Jung Kim
(74) *Attorney, Agent, or Firm* — Allen & Overy, LLP

(57) ABSTRACT

A semiconductor device includes an I/O circuit configured to be supplied with a first voltage, a second voltage higher than the first voltage, and a third voltage higher than the second voltage, and to receive an input signal based on the first voltage. The I/O circuit includes an enabler circuit configured to be supplied with the second voltage, and to generate a first signal based on the second voltage, and a first level shifter circuit coupled to the enabler circuit, and configured to, based on the first signal, level-shift a signal based on the second voltage to a signal based on the third voltage.

11 Claims, 15 Drawing Sheets

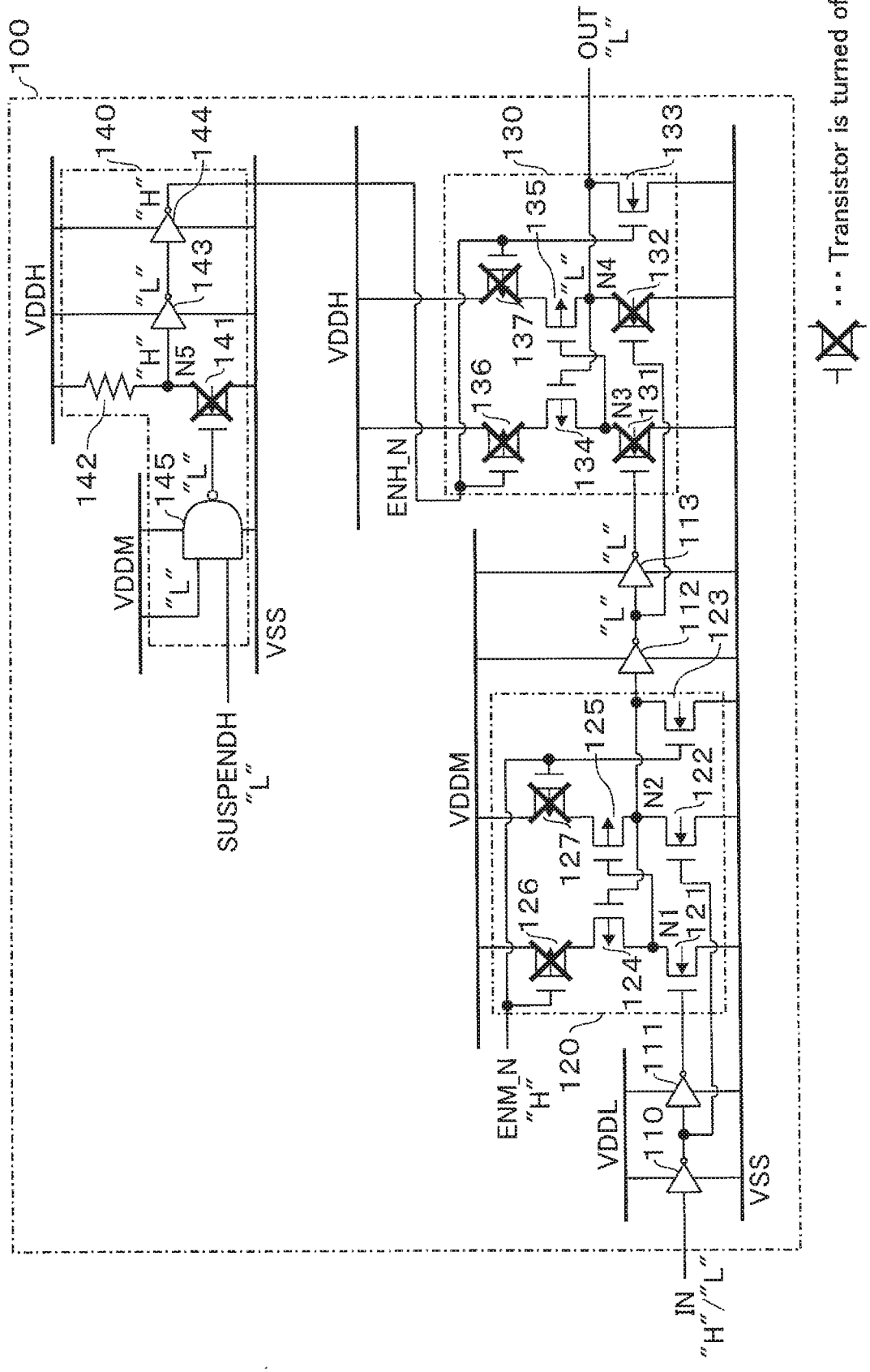
F I G. 12

SEMICONDUCTOR DEVICE

CROSS-REFERENCE TO RELATED APPLICATIONS

This application is based upon and claims the benefit of priority from Japanese Patent Application No. 2020-040768, filed Mar. 10, 2020, the entire contents of which are incorporated herein by reference.

FIELD

Embodiments described herein relate generally to a semiconductor device.

BACKGROUND

A semiconductor device including a level shifter circuit is known.

BRIEF DESCRIPTION OF THE DRAWINGS

FIG. 12 is a diagram illustrating an operation of the I/O circuit included in the semiconductor device according to the second embodiment.

DETAILED DESCRIPTION

In general, according to one embodiment, a semiconductor device includes an I/O circuit configured to be supplied with a first voltage, a second voltage higher than the first voltage, and a third voltage higher than the second voltage, and to receive an input signal based on the first voltage. The I/O circuit includes an enabler circuit configured to be supplied with the second voltage, and to generate a first signal based on the second voltage, and a first level shifter circuit coupled to the enabler circuit, and configured to, based on the first signal, level-shift a signal based on the second voltage to a signal based on the third voltage.

Hereinafter, embodiments will be described with reference to the drawings. In the description below, constituent elements having the same function and configuration will be assigned a common reference symbol.

1. First Embodiment

A semiconductor device according to a first embodiment will be described. Hereinafter, a system-on-a-chip (SOC) including an I/O circuit provided with a plurality of level shifter circuits in multiple stages will be described as an example.

1.1 Configuration

1.1.1 Overall Configuration of SOC

First, a rough overall configuration of an SOC according to the present embodiment will be described with reference to FIG. 1.

Figure 1:
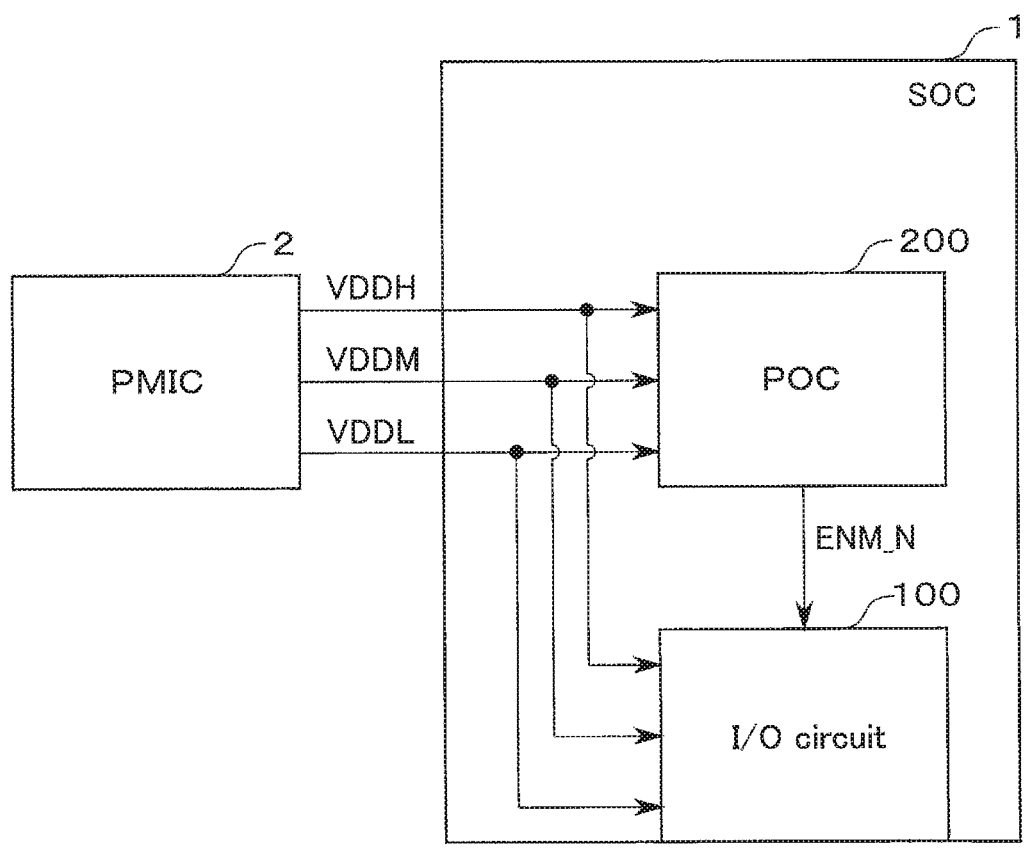
FIG. 1 is a block diagram of a semiconductor device according to a first embodiment.

FIG. 1 is a block diagram of an SOC 1 according to the present embodiment. The SOC 1 includes an I/O circuit 100 and a power-on control (POC) circuit 200. The number of I/O circuits 100 in the SOC 1 is not limited to one.

The I/O circuit 100 is supplied with power supply voltages VDDL, VDDM, and VDDH by, for example, a power management IC (PMIC) 2. The voltages VDDL, VDDM, and VDDH have the relationship VDDL<VDDM<VDDH. The voltage VDDL is, for example, 1.1 V. The voltage VDDM is, for example, 3.3 V. The voltage VDDH is, for example, 5 V. The VDDL is not limited to 1.1 V. The voltage VDDM is not limited to 3.3 V. The voltage VDDH is not limited to 5 V.

The I/O circuit 100 controls input and output of signals between an external device (not shown) and the SOC 1. The I/O circuit 100 transmits an input signal received from an external device to any circuit (not shown) in the SOC 1. The I/O circuit 100 includes level shifter circuits to be described later. For example, the I/O circuit 100 level-shifts an input signal based on the voltage VDDL received from an external device to a signal based on the voltage VDDM or voltage VDDH, and transmits the level-shifted signal to another circuit in the SOC 1.

The I/O circuit 100 also outputs a signal received from any circuit (not shown) in the SOC 1 to an external device.

The I/O circuit 100 receives a signal ENM_N from the POC circuit 200. Details of the signal ENM_N will be described later.

The POC circuit 200 is supplied with the power supply voltages VDDL, VDDM, and VDDH by, for example, the PMIC 2. The POC circuit 200 monitors the states of the voltages VDDL and VDDM in the SOC 1, and judges whether or not the voltages are active. The term "active" in regard to the states of power supply voltages means that the power supply voltage is at a high ("H") level (the power supply voltage is larger than or equal to a preset voltage value) herein. The term "inactive" in regard to the states of power supply voltages means that the power supply voltage is at a low ("L") level (the power supply voltage is smaller than a preset voltage value).

The POC circuit 200 also transmits a signal ENM_N, which indicates whether or not the voltage VDDM in the SOC 1 is active, to the I/O circuit 100. Specifically, when the voltage VDDM is active for example, the POC circuit 200 transmits an "L"-level signal ENM_N to the I/O circuit 100. On the other hand, when the voltage VDDM is inactive, the POC circuit 200 transmits an "H"-level signal ENM_N to the I/O circuit 100.

1.1.2 Configuration of I/O Circuit 100

Details of the configuration of the I/O circuit 100 included in the SOC 1 according to the present embodiment will be described with reference to FIG. 2.

Figure 2:
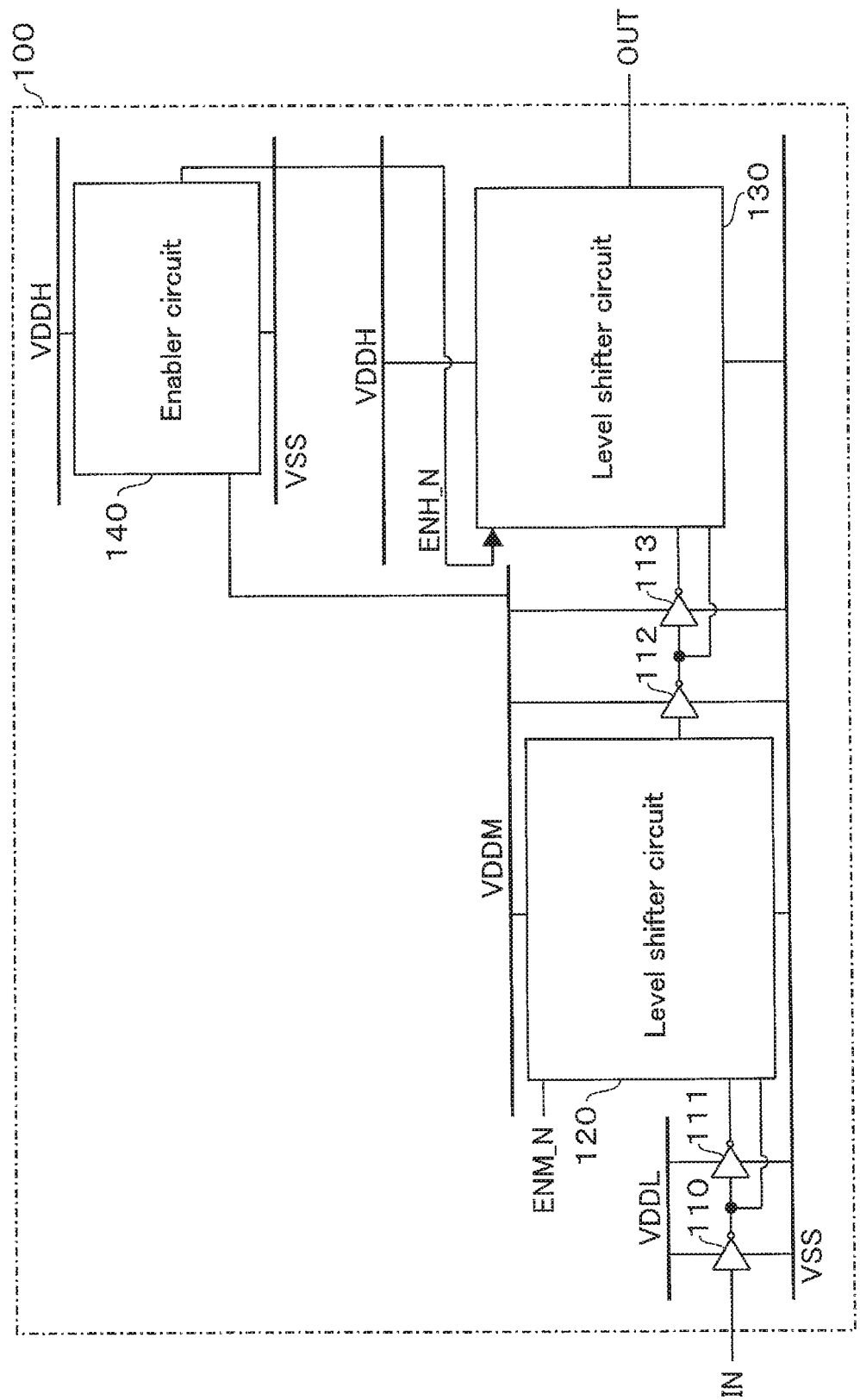
FIG. 2 is a circuit diagram showing part of an input/output (I/O) circuit included in the semiconductor device according to the first embodiment.

FIG. 2 is a circuit diagram showing part of the I/O circuit 100. The I/O circuit 100 is supplied with the voltage VDDL, the voltage VDDM, the voltage VDDH, and a ground voltage VSS. The I/O circuit 100 includes inverter circuits 110 to 113, level shifter circuits 120 and 130, and an enabler circuit 140.

The inverter circuit 110 operates using the voltage VDDL as the operating voltage. The inverter circuit 110 receives an input signal IN based on the voltage VDDL from, for example, an external device. The inverter circuit 110 then transmits a signal obtained by inverting the logical level of the received signal to the inverter circuit 111 and the level shifter circuit 120.

Like the inverter circuit 110, the inverter circuit 111 operates using the voltage VDDL as the operating voltage. The inverter circuit 111 receives the signal from the inverter circuit 110. The inverter circuit 111 then transmits a signal obtained by inverting the logical level of the received signal to the level shifter circuit 120.

The inverter circuit 112 operates using the voltage VDDM as the operating voltage. The inverter circuit 112 receives the signal from the level shifter circuit 120. The inverter circuit 112 then transmits a signal obtained by inverting the logical level of the received signal to the inverter circuit 113 and the level shifter circuit 130.

Like the inverter circuit 112, the inverter circuit 113 operates using the voltage VDDM as the operating voltage. The inverter circuit 113 receives the signal from the inverter circuit 112. The inverter circuit 113 then transmits a signal obtained by inverting the logical level of the received signal to the level shifter circuit 130.

The level shifter circuit 120 converts an input signal into a signal having a higher voltage (signal) level than the input signal. Then, the level shifter circuit 120 outputs the converted signal as an output signal. Specifically, the level shifter circuit 120 operates using the voltage VDDM as the operating voltage. The level shifter circuit 120 receives a signal ENM_N from the POC circuit 200. The signal ENM_N is used for control of the operation of the level shifter circuit 120. Based on the received signal ENM_N, the level shifter circuit 120 level-shifts the input signal IN based on the voltage VDDL to a signal based on the voltage VDDM. The level shifter circuit 120 transmits the level-shifted signal based on the voltage VDDM to the inverter circuit 112.

Like the level shifter circuit 120, the level shifter circuit 130 converts an input signal into a signal having a higher voltage (signal) level than the input signal. Then, the level shifter circuit 130 outputs the converted signal as an output signal. Specifically, the level shifter circuit 130 operates using the voltage VDDH as the operating voltage. The level shifter circuit 130 receives a signal ENH_N from the enabler circuit 140. The signal ENH_N is a signal for controlling the operation of the level shifter circuit 130. Based on the received signal ENH_N, the level shifter circuit 130 level-shifts the signal based on the voltage VDDM, which has been received from the level shifter circuit 120, to a signal based on the voltage VDDH. The level shifter circuit 130 transmits the level-shifted signal based on the voltage VDDH to another circuit in the SOC 1 as an output signal OUT. Between the level shifter circuit 130 and another circuit in the SOC 1, another circuit element such as an inverter circuit or a logic gate may be provided.

The numbers of the level shifter circuits 120 and the level shifter circuits 130 in the I/O circuit 100 are not limited to one. For example, when there are a plurality of signal input terminals in the I/O circuit 100, the level shifter circuits 120 and 130 are provided for each input terminal of the I/O circuit 100 as needed.

The enabler circuit 140 generates a signal ENH_N based on the state of the voltage VDDM. Then, the enabler circuit 140 transmits the generated signal ENH_N to the level shifter circuit 130. Specifically, the enabler circuit 140 operates using the voltage VDDH as the operating voltage. The voltage VDDM is applied to the enabler circuit 140. For example, when the voltage VDDM is active, the enabler circuit 140 generates an "L"-level signal ENH_N, and transmits the generated "L"-level signal ENH_N to the level shifter circuit 130. When the voltage VDDM is inactive, the enabler circuit 140 generates an "H"-level signal ENH_N, and transmits the generated "H"-level signal ENH_N to the level shifter circuit 130. When there are a plurality of level shifter circuits 130 in the I/O circuit 100, the enabler circuit 140 transmits the generated signal ENH_N to each of the level shifter circuits 130.

1.1.2.1 Configurations of Level Shifter Circuits 120 and 130

Figure 3:
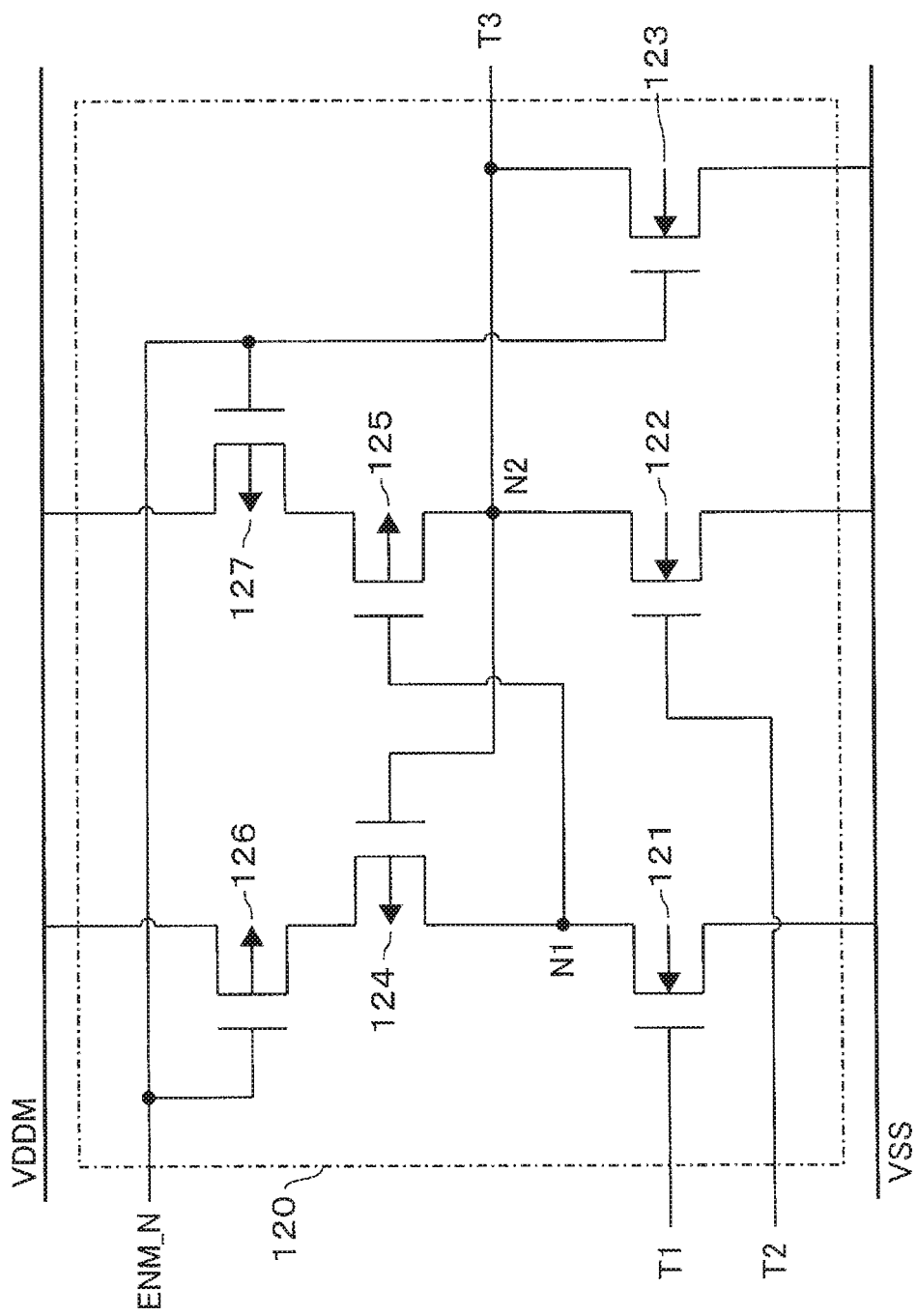
FIG. 3 is a circuit diagram of a level shifter circuit in the I/O circuit included in the semiconductor device according to the first embodiment.
Figure 4:
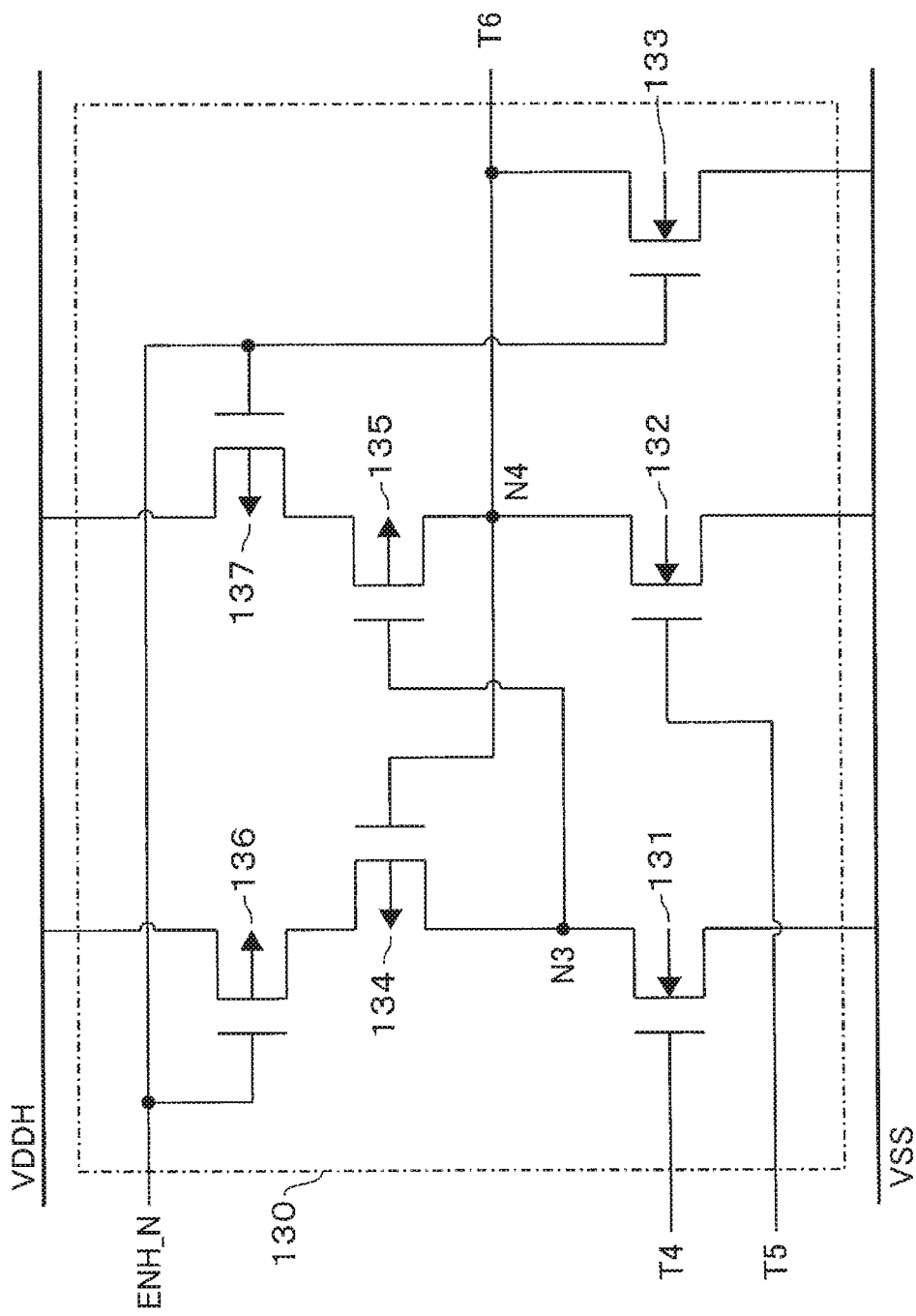
FIG. 4 is a circuit diagram of a level shifter circuit in the I/O circuit included in the semiconductor device according to the first embodiment.

Details of the configurations of the level shifter circuits 120 and 130 in the I/O circuit 100 included in the SOC 1 according to the present embodiment will be described with reference to FIGS. 3 and 4.

First, the level shifter circuit 120 will be described. FIG. 3 is a circuit diagram of the level shifter circuit 120. The level shifter circuit 120 includes n-channel MOS transistors 121 to 123 and p-channel MOS transistors 124 to 127.

The output signal of the inverter circuit 111 is input through an input terminal T1 to the gate of the transistor 121. The ground voltage VSS is applied to the source of the transistor 121, and the drain of the transistor 121 is coupled to a node N1.

The output signal of the inverter circuit 110 is input through an input terminal T2 to the gate of the transistor 122. The ground voltage VSS is applied to the source of the transistor 122, and the drain of the transistor 122 is coupled to a node N2.

The signal ENM_N is input to the gate of the transistor 123. The ground voltage VSS is applied to the source of the transistor 123, and the drain of the transistor 123 is coupled to the node N2.

The gate of the transistor 124 is coupled to the node N2, the drain thereof is coupled to the node N1, and the source thereof is coupled to the drain of the transistor 126.

The gate of the transistor 125 is coupled to the node N1, the drain thereof is coupled to the node N2, and the source thereof is coupled to the drain of the transistor 127.

The signal ENM_N is input to the gate of the transistor 126. The voltage VDDM is applied to the source of the transistor 126.

The signal ENM_N is input to the gate of the transistor 127. The voltage VDDM is applied to the source of the transistor 127.

The level shifter circuit 120 outputs, from an output terminal T3, a signal based on the potential of the node N2.

Next, the level shifter circuit 130 will be described. FIG. 4 is a circuit diagram of the level shifter circuit 130. The level shifter circuit 130 includes n-channel MOS transistors 131 to 133 and p-channel MOS transistors 134 to 137.

The output signal of the inverter circuit 113 is input through an input terminal T4 to the gate of the transistor 131. The ground voltage VSS is applied to the source of the transistor 131, and the drain of the transistor 131 is coupled to a node N3.

The output signal of the inverter circuit 112 is input through an input terminal T5 to the gate of the transistor 132. The ground voltage VSS is applied to the source of the transistor 132, and the drain of the transistor 132 is coupled to a node N4.

The signal ENH_N is input to the gate of the transistor 133. The ground voltage VSS is applied to the source of the transistor 133, and the drain of the transistor 133 is coupled to the node N4.

The gate of the transistor 134 is coupled to the node N4, the drain thereof is coupled to the node N3, and the source thereof is coupled to the drain of the transistor 136.

The gate of the transistor 135 is coupled to the node N3, the drain thereof is coupled to the node N4, and the source thereof is coupled to the drain of the transistor 137.

The signal ENH_N is input to the gate of the transistor 136. The voltage VDDH is applied to the source of the transistor 136.

The signal ENH_N is input to the gate of the transistor 137. The voltage VDDH is applied to the source of the transistor 137.

The level shifter circuit 130 outputs, from an output terminal T6, a signal based on the potential of the node N4 as the output signal OUT.

1.1.2.2 Configuration of Enabler Circuit 140

Details of the configuration of the enabler circuit 140 in the I/O circuit 100 included in the SOC 1 according to the present embodiment will be described with reference to FIG. 5.

Figure 5:
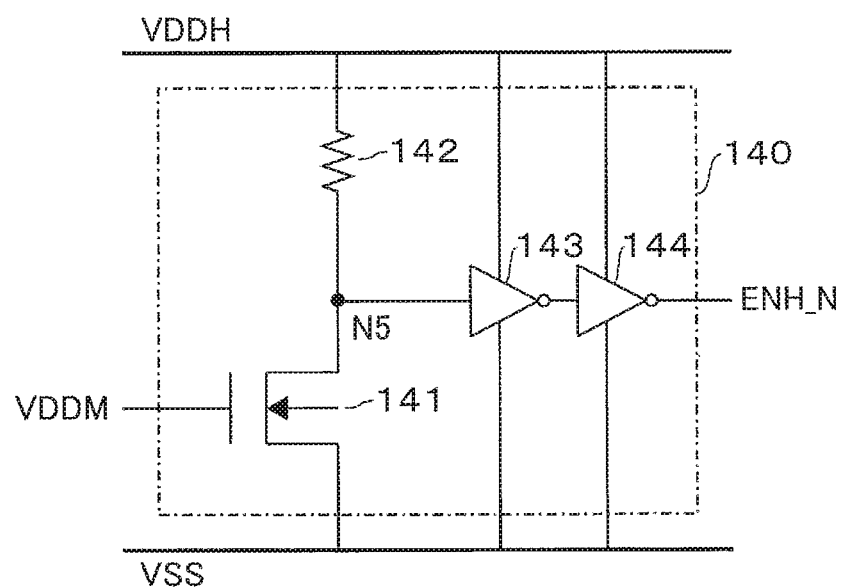
FIG. 5 is a circuit diagram of an enabler circuit in the I/O circuit included in the semiconductor device according to the first embodiment.

FIG. 5 is a circuit diagram of the enabler circuit 140. The enabler circuit 140 includes an n-channel MOS transistor 141, a resistance element 142, and inverter circuits 143 and 144.

The voltage VDDM is applied to the gate of the transistor 141. The ground voltage VSS is applied to the source of the transistor 141, and the drain of the transistor 141 is coupled to a node N5.

One end of the resistance element 142 is coupled to the node N5. The voltage VDDH is applied to the other end of the resistance element 142. The resistance element 142 is, for example, 1 MΩ. The resistance element 142 is not limited to 1 MΩ.

The inverter circuit 143 operates using the voltage VDDH as the operating voltage. The inverter circuit 143 receives a signal based on the potential of the node N5. Specifically, when the transistor 141 is ON, an "L"-level voltage (signal) is applied to the input terminal of the inverter circuit 143. When the transistor 141 is OFF, an "H"-level voltage (signal) is applied to the input terminal of the inverter circuit 143. The inverter circuit 143 transmits a signal obtained by inverting the logical level of the received signal to the inverter circuit 144.

Like the inverter circuit 143, the inverter circuit 144 operates using the voltage VDDH as the operating voltage. The inverter circuit 144 receives the signal from the inverter circuit 143. Then, the inverter circuit 144 transmits a signal ENH_N obtained by inverting the logical level of the received signal to the level shifter circuit 130.

The circuit threshold voltage of the series circuit of the transistor 141 and the resistance element 142 is adjusted by the size of the transistor 141 (L/W, etc.) and the resistance value of the resistance element 142. Specifically, for example when it is desired that the threshold voltage of the transistor 141 be set low, i.e., when the transistor 141 is desired to be turned on with a relatively low voltage VDDM, the resistance value of the resistance element 142 is set to be relatively large. When it is desired that the threshold voltage of the transistor 141 be set high, i.e., when the transistor 141 is desired to be turned on with a relatively high voltage VDDM, the resistance value of the resistance element 142 is set to be relatively small.

1.2 Operation of I/O Circuit 100

Next, the operation of the I/O circuit 100 included in the SOC 1 according to the present embodiment will be described with reference to FIGS. 6 to 8.

First, the case where the voltage VDDM is active and the input signal IN is at the "H" level (voltage VDDL) will be described. FIG. 6 is a diagram illustrating the operation of the I/O circuit 100 when the voltage VDDM is active and the input signal IN is at the "H" level.

Figure 6:
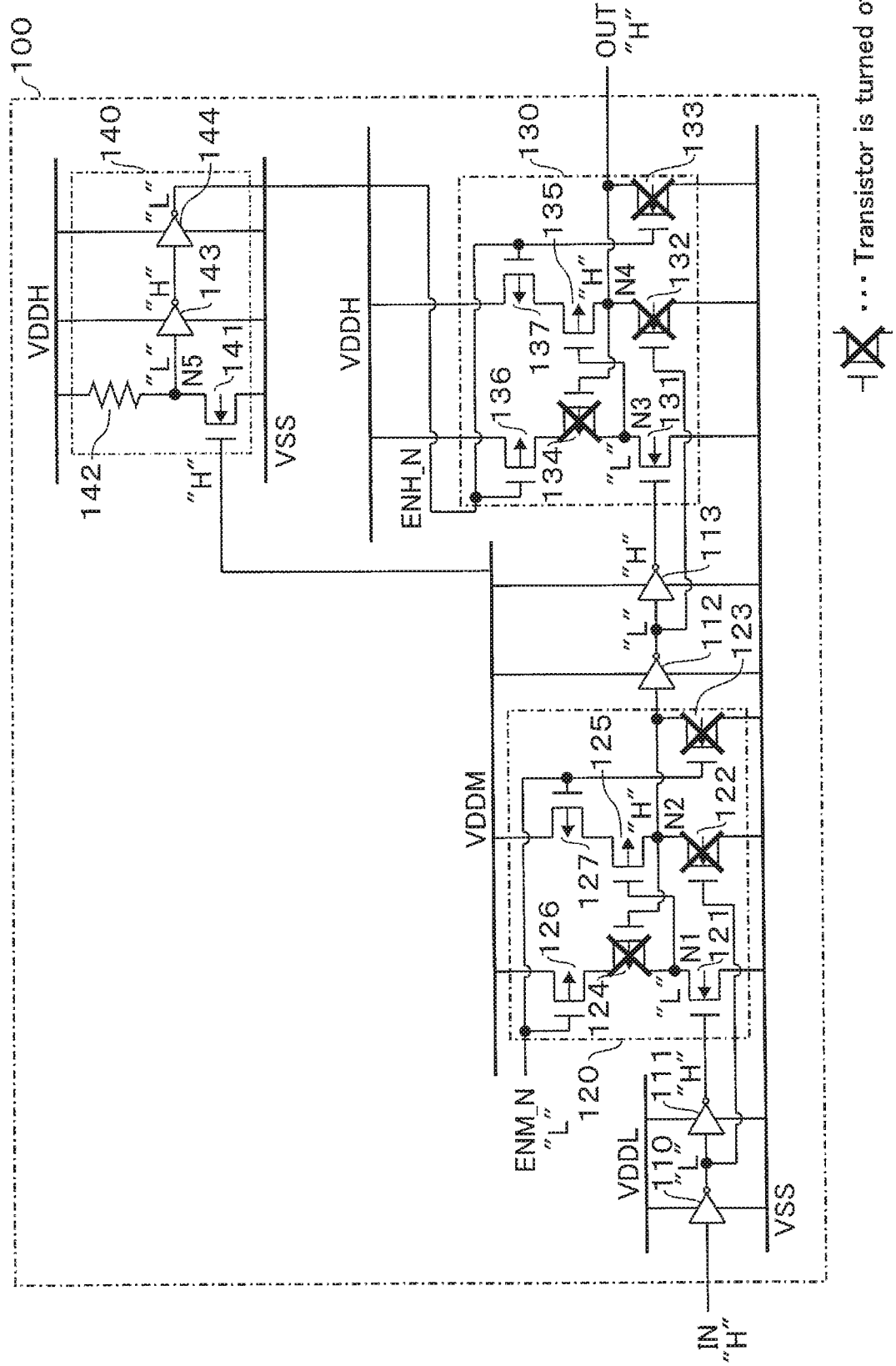
FIG. 6 is a diagram illustrating an operation of the I/O circuit included in the semiconductor device according to the first embodiment.

As shown in FIG. 6, the inverter circuit 110 receives an "H"-level input signal IN from an external device. The inverter circuit 110 transmits an "L"-level signal obtained by inverting the logical level of the "H"-level signal to the inverter circuit 111 and the gate of the transistor 122 of the level shifter circuit 120. The inverter circuit 111 transmits an "H"-level signal obtained by inverting the logical level of the "L"-level signal to the gate of the transistor 121 of the level shifter circuit 120.

The "H"-level signal received from the inverter circuit 111 is input to the gate of the transistor 121. Since the signal received from the inverter circuit 111 is at the "H" level, the transistor 121 is turned on. The "L"-level signal received from the inverter circuit 110 is input to the gate of the transistor 122. Since the signal received from the inverter circuit 110 is at the "L" level, the transistor 122 is turned off. Since the voltage VDDM is active, the POC circuit 200 transmits the "L"-level signal ENM_N to the level shifter circuit 120. The "L"-level signal ENM_N received from the POC circuit 200 is input to each of the gates of the transistors 123, 126, and 127 of the level shifter circuit 120. Since the signal ENM_N is at the "L" level, the transistor 123 is turned off, whereas the transistors 126 and 127 are turned on. Since the transistor 121 is ON, the potential of the node N1 is brought to the "L" level. Accordingly, the transistor 125 is turned on. Since the transistors 125 and 127 are ON, the potential of the node N2 is brought to the "H" level. Accordingly, the transistor 124 is turned off. As a result, the level shifter circuit 120 transmits an "H"-level signal (voltage VDDM) to the inverter circuit 112.

The inverter circuit 112 receives the "H"-level signal from the level shifter circuit 120. The inverter circuit 112 transmits an "L"-level signal obtained by inverting the logical level of the "H"-level signal to the inverter circuit 113 and the gate of the transistor 132 of the level shifter circuit 130. The inverter circuit 113 transmits an "H"-level signal obtained by inverting the logical level of the "L"-level signal to the gate of the transistor 131 of the level shifter circuit 130.

The enabler circuit 140 receives an active voltage VDDM, i.e., an "H"-level signal. The transistor 141 is turned on since the "H"-level signal is input to its gate. As a result, the potential of the node N5 is brought to the "L" level. Accordingly, the inverter circuit 143 receives an "L"-level signal. The inverter circuit 143 transmits an "H"-level signal obtained by inverting the logical level of the "L"-level signal to the inverter circuit 144. The inverter circuit 144 transmits an "L"-level signal ENH_N obtained by inverting the logical level of the "H"-level signal to the level shifter circuit 130.

The "H"-level signal received from the inverter circuit 113 is input to the gate of the transistor 131. Since the signal received from the inverter circuit 113 is at the "H" level, the transistor 131 is turned on. The "L"-level signal received from the inverter circuit 112 is input to the gate of the transistor 132. Since the signal received from the inverter circuit 112 is at the "L" level, the transistor 132 is turned off. The "L"-level signal ENH_N received from the enabler circuit 140 is input to each of the gates of the transistors 133, 136, and 137 of the level shifter circuit 130. Since the signal ENH_N is at the "L" level, the transistor 133 is turned off, whereas the transistors 136 and 137 are turned on. Since the transistor 131 is ON, the potential of the node N3 is brought to the "L" level. Accordingly, the transistor 135 is turned on. Since the transistors 135 and 137 are ON, the potential of the node N4 is brought to the "H" level. Accordingly, the transistor 134 is turned off. As a result, the level shifter circuit 130 outputs an "H"-level signal (voltage VDDH) as the output signal OUT.

Next, the case where the voltage VDDM is active and the input signal IN is at the "L" level will be described. FIG. 7 is a diagram illustrating the operation of the I/O circuit 100 when the voltage VDDM is active and the input signal IN is at the "L" level.

Figure 7:
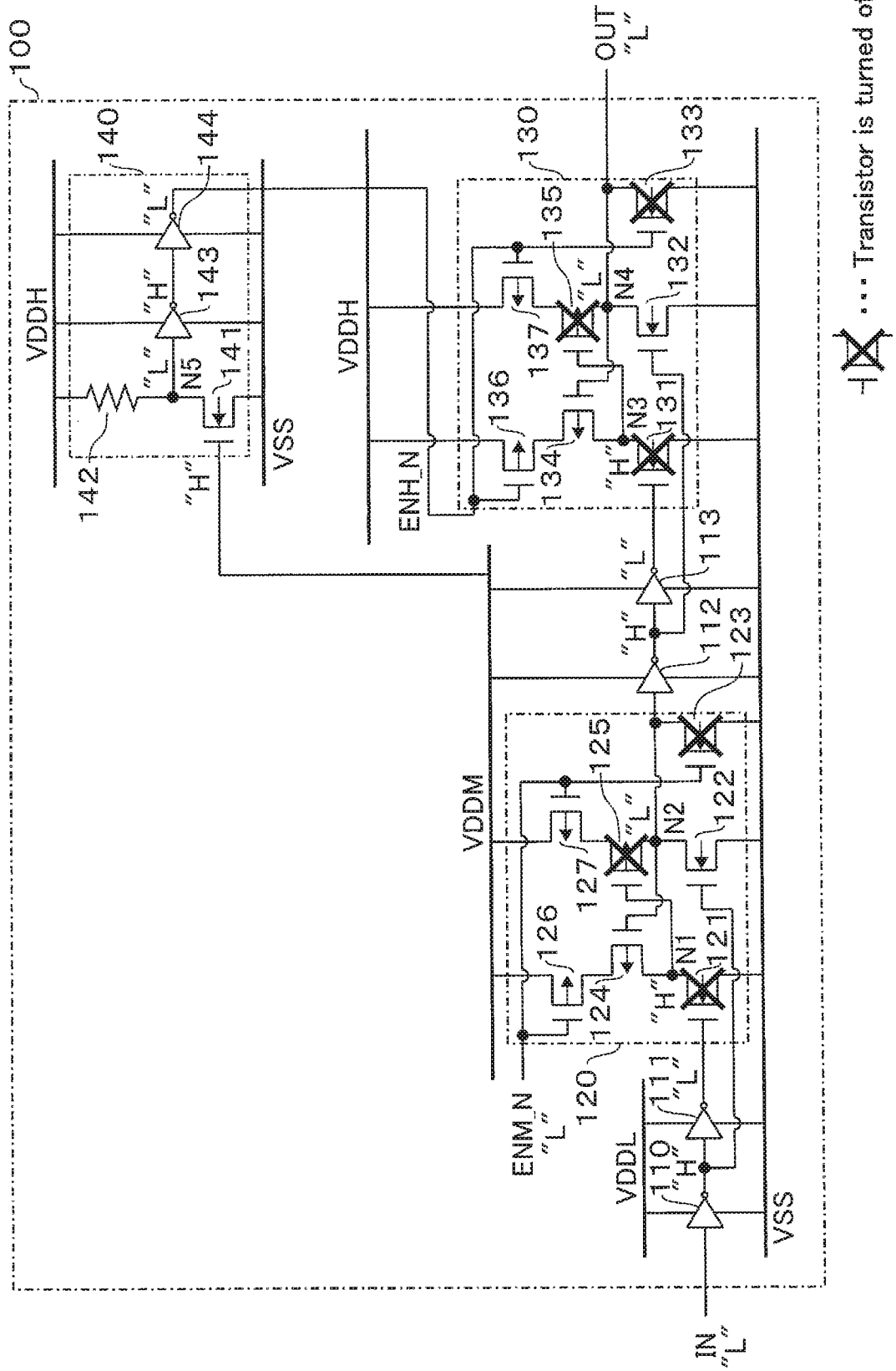
FIG. 7 is a diagram illustrating an operation of the I/O circuit included in the semiconductor device according to the first embodiment.

As shown in FIG. 7, the inverter circuit 110 receives an "L"-level input signal IN from an external device. The inverter circuit 110 transmits an "H"-level signal obtained by inverting the logical level of the "L"-level signal to the inverter circuit 111 and the gate of the transistor 122 of the level shifter circuit 120. The inverter circuit 111 transmits an "L"-level signal obtained by inverting the logical level of the "H"-level signal to the gate of the transistor 121 of the level shifter circuit 120.

The "L"-level signal received from the inverter circuit 111 is input to the gate of the transistor 121. Since the signal received from the inverter circuit 111 is at the "L" level, the transistor 121 is turned off. The "H"-level signal received from the inverter circuit 110 is input to the gate of the transistor 122. Since the signal received from the inverter circuit 110 is at the "H" level, the transistor 122 is turned on. Since the voltage VDDM is active, the POC circuit 200 transmits the "L"-level signal ENM_N to the level shifter circuit 120. The "L"-level signal ENM_N received from the POC circuit 200 is input to each of the gates of the transistors 123, 126, and 127 of the level shifter circuit 120. Since the signal ENM_N is at the "L" level, the transistor 123 is turned off, whereas the transistors 126 and 127 are turned on. Since the transistor 122 is ON, the potential of the node N2 is brought to the "L" level. Accordingly, the transistor 124 is turned on. Since the transistors 124 and 126 are ON, the potential of the node N1 is brought to the "H" level. Accordingly, the transistor 125 is turned off. As a result, the level shifter circuit 120 transmits an "L"-level signal to the inverter circuit 112.

The inverter circuit 112 receives the "L"-level signal from the level shifter circuit 120. The inverter circuit 112 transmits an "H"-level signal obtained by inverting the logical level of the "L"-level signal to the inverter circuit 113 and the gate of the transistor 132 of the level shifter circuit 130. The inverter circuit 113 transmits an "L"-level signal obtained by inverting the logical level of the "H"-level signal to the gate of the transistor 131 of the level shifter circuit 130.

The enabler circuit 140 performs the same operation as that in the case of FIG. 6, and transmits an "L"-level signal ENH_N to the level shifter circuit 130.

The "L"-level signal received from the inverter circuit 113 is input to the gate of the transistor 131. Since the signal received from the inverter circuit 113 is at the "L" level, the transistor 131 is turned off. The "H"-level signal received from the inverter circuit 112 is input to the gate of the transistor 132. Since the signal received from the inverter circuit 112 is at the "H" level, the transistor 132 is turned on. The "L"-level signal ENH_N received from the enabler circuit 140 is input to each of the gates of the transistors 133, 136, and 137 of the level shifter circuit 130. Since the signal ENH_N is at the "L" level, the transistor 133 is turned off, whereas the transistors 136 and 137 are turned on. Since the transistor 132 is ON, the potential of the node N4 is brought to the "L" level. Accordingly, the transistor 134 is turned on. Since the transistors 134 and 136 are ON, the potential of the node N3 is brought to the "H" level. Accordingly, the transistor 135 is turned off. As a result, the level shifter circuit 130 outputs an "L"-level signal as the output signal OUT.

Next, the case where the voltage VDDM is inactive (such as the voltage VSS) will be described. The case where the voltage VDDM is inactive is, for example, the case where supply of the voltage VDDM from the PMIC 2 is suspended. FIG. 8 is a diagram illustrating the operation of the I/O circuit 100 when the voltage VDDM is inactive.

Figure 8:
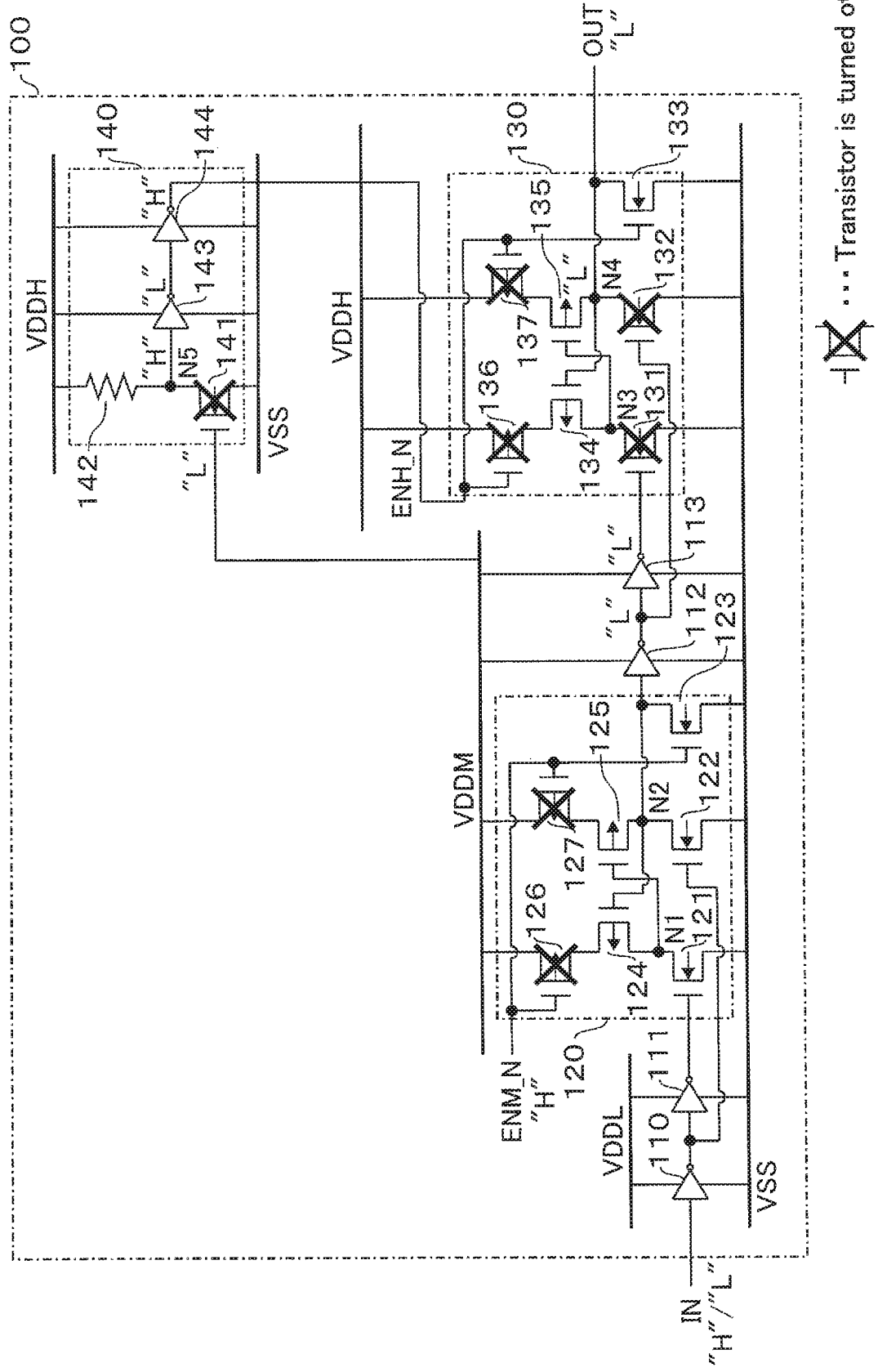
FIG. 8 is a diagram illustrating an operation of the I/O circuit included in the semiconductor device according to the first embodiment.

As shown in FIG. 8, the inverter circuit 110 receives an "H"/"L"-level input signal IN from an external device. The inverter circuit 110 transmits a signal obtained by inverting the logical level of the input signal IN to the inverter circuit 111 and the gate of the transistor 122 of the level shifter circuit 120. The inverter circuit 111 transmits a signal obtained by inverting the logical level of the signal received from the inverter circuit 110 to the gate of the transistor 121 of the level shifter circuit 120.

The signal received from the inverter circuit 111 is input to the gate of the transistor 121. The signal received from the inverter circuit 110 is input to the gate of the transistor 122. The transistors 121 and 122 are turned on and off according to the logical level of the input signal IN. Since the voltage VDDM is inactive, the POC circuit 200 transmits an "H"-level signal ENM_N to the level shifter circuit 120. The "H"-level signal ENM_N received from the POC circuit 200 is input to each of the gates of the transistors 123, 126, and 127 of the level shifter circuit 120. Since the signal ENM_N is at the "H" level, the transistor 123 is turned on, whereas the transistors 126 and 127 are turned off.

Since the voltage VDDM is inactive, the inverter circuit 112 transmits an "L"-level signal to the inverter circuit 113 and the gate of the transistor 132 of the level shifter circuit 130 regardless of the signal received from the level shifter circuit 120. Like the inverter circuit 112, the inverter circuit 113 transmits an "L"-level signal to the gate of the transistor 131 of the level shifter circuit 130 regardless of the signal received from the inverter circuit 112.

The enabler circuit 140 receives an inactive voltage VDDM, i.e., an "L"-level signal. The transistor 141 is turned off since the "L"-level signal is input to its gate. As a result, the potential of the node N5 is brought to the "H" level. Accordingly, the inverter circuit 143 receives an "H"-level signal. The inverter circuit 143 transmits an "L"-level signal obtained by inverting the logical level of the "H"-level signal to the inverter circuit 144. The inverter circuit 144 transmits an "H"-level signal ENH_N obtained by inverting the logical level of the "L"-level signal to the level shifter circuit 130.

The "L"-level signal received from the inverter circuit 113 is input to the gate of the transistor 131. Since the signal received from the inverter circuit 113 is at the "L" level, the transistor 131 is turned off. The "L"-level signal received from the inverter circuit 112 is input to the gate of the transistor 132. Since the signal received from the inverter circuit 112 is at the "L" level, the transistor 132 is turned off. The "H"-level signal ENH_N received from the enabler circuit 140 is input to each of the gates of the transistors 133, 136, and 137 of the level shifter circuit 130. Since the signal ENH_N is at the "H" level, the transistor 133 is turned on, whereas the transistors 136 and 137 are turned off. Since the transistor 133 is ON, the potential of the node N4 is brought to the "L" level. Accordingly, the level shifter circuit 130 outputs an "L"-level signal as the output signal OUT.

1.3 Advantageous Effects of Present Embodiment

The configuration according to the present embodiment can improve the reliability of the semiconductor device. These advantageous effects will be described below.

For example, there is a case where a level shifter circuit that level-shifts a signal based on the voltage VDDM to a signal based on the voltage VDDH cannot receive (cannot be supplied with) a signal ENH_N externally. When the signal ENH_N cannot be received, the ENH_N may be fixed at the "L" level, for example. In such a case, the level shifter circuit operates based on the "L"-level signal ENH_N. Therefore, when the voltage VDDM becomes inactive (for example, 0 V), the output signal of the level shifter circuit may become inconstant. In addition, when the voltage VDDM is indeterminate, a flow-through leak current may be generated in the level shifter circuit. The case where the voltage VDDM is indeterminate means the case where the voltage VDDM is not 0 V, such as the case where the voltage VDDM is power-saved.

In the SOC 1 according to the present embodiment, the I/O circuit 100 includes the enabler circuit 140 configured to generates a signal ENH_N based on the voltage VDDM, the level shifter circuit 120 configured to level-shift an input signal IN based on the voltage VDDL to a signal based on the VDDM on the basis of the signal ENH_N, and the level shifter circuit 130 configured to level-shift the signal based on the voltage VDDM to a signal based on the voltage VDDH. This configuration enables the enabler circuit 140 to output an "H"-level signal ENH_N when the voltage VDDM is inactive. This prevents the output signal OUT of the level shifter circuit 130 from becoming inconstant. This also enables the SOC 1 to suppress the flow-through leak current from the voltage VDDH at the level shifter circuit 130 to the ground voltage VSS. Accordingly, the reliability of the SOC 1 can be improved.

2. Second Embodiment

Next, a semiconductor device according to a second embodiment will be described. In the present embodiment, the configuration of the enabler circuit 140 described in the first embodiment is changed. In the following description, only matters different from the first embodiment will be described.

2.1 Configuration of Enabler Circuit 140

The enabler circuit 140 in the I/O circuit 100 included in the SOC 1 according to the present embodiment is the enabler circuit 140 in FIG. 5 additionally provided with a NAND circuit 145. Hereinafter, details of the configuration of the enabler circuit 140 will be described with reference to FIG. 9.

Figure 9:
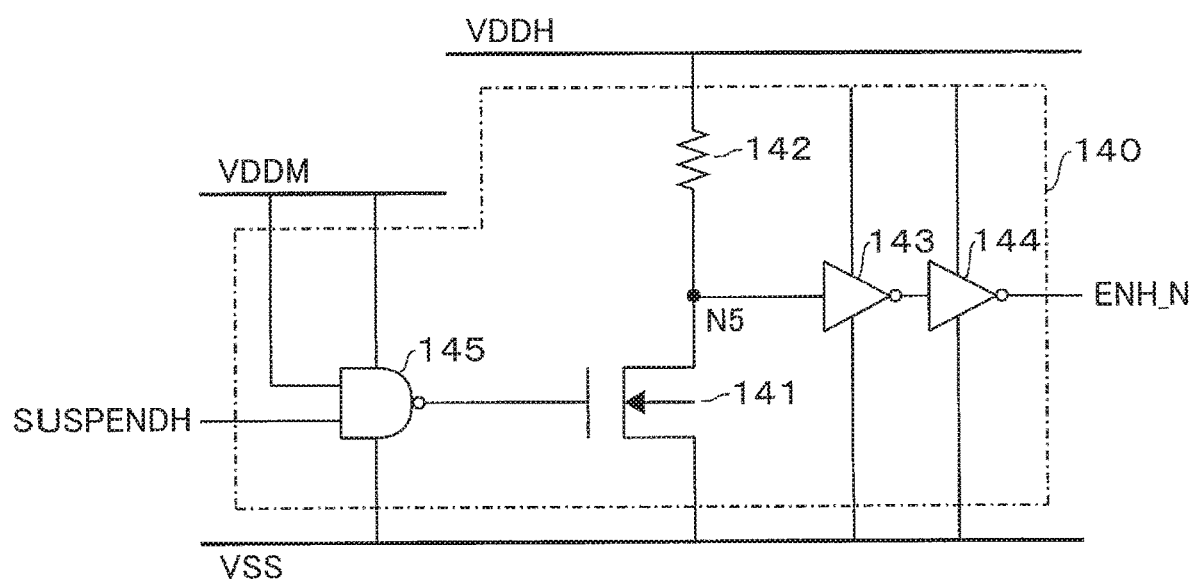
FIG. 9 is a circuit diagram of an enabler circuit in an I/O circuit included in a semiconductor device according to a second embodiment.

FIG. 9 is a circuit diagram of the enabler circuit 140. The enabler circuit 140 includes an n-channel MOS transistor 141, a resistance element 142, inverter circuits 143 and 144, and a NAND circuit 145.

The NAND circuit 145 operates using the voltage VDDM as the operating voltage. The voltage VDDM is applied to one input terminal of the NAND circuit 145, and a signal SUSPENDH is input to the other input terminal. The NAND circuit 145 performs a NAND operation based on the state of the voltage VDDM and the signal SUSPENDH. Then, the NAND circuit 145 transmits the operation result to the gate of the transistor 141.

The signal SUSPENDH is a signal that controls whether or not the circuit block (functional block) supplied with the voltage VDDH in the SOC 1 can be used. The signal SUSPENDH is a value set by a user action or control by the SOC 1, and is retained in, for example, a resistor (not shown) in the SOC 1. Specifically, for example when the circuit block supplied with the voltage VDDH in the SOC 1 is not used (such as when the user closes the cover of a notebook PC equipped with the SOC 1, or when the SOC 1 provides the I/O circuit 100 with an idle instruction for power-saving), the signal SUSPENDH is brought to the "H" level. In this case, the level shifter circuit 130 outputs an "L"-level signal regardless of the input signal IN. On the other hand, when the circuit block supplied with the voltage VDDH in the SOC 1 is used, the signal SUSPENDH is brought to the "L" level. In this case, a signal is level-shifted at the level shifter circuit 130.

2.2 Operation of I/O Circuit 100

Next, the operation of the I/O circuit 100 included in the SOC 1 according to the present embodiment will be described with reference to FIGS. 10 to 15.

First, the case where a signal is level-shifted at the level shifter circuit 130 will be described.

Figure 10:
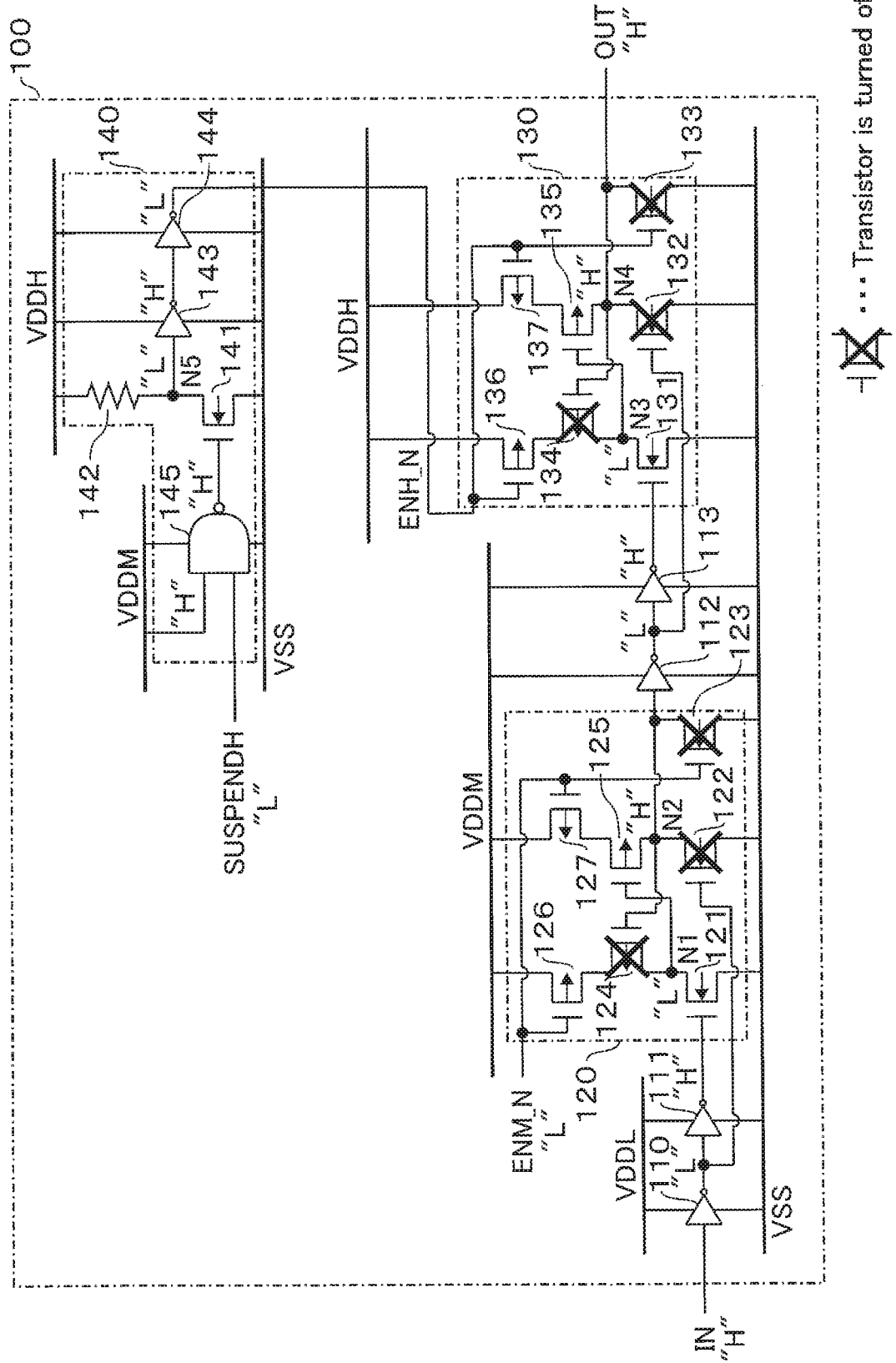
FIG. 10 is a diagram illustrating an operation of the I/O circuit included in the semiconductor device according to the second embodiment.

First, the case where the voltage VDDM is active, the signal SUSPENDH is at the "L" level, and the input signal IN is at the "H" level will be described. FIG. 10 is a diagram illustrating the operation of the I/O circuit 100 when the voltage VDDM is active, the signal SUSPENDH is at the "L" level, and the input signal IN is at the "H" level. The operations other than that of the enabler circuit 140 are the same as those in the case of FIG. 6; therefore, the operation of the enabler circuit 140 will be described below.

As shown in FIG. 10, an active voltage VDDM, i.e., an "H"-level signal, is input to one input terminal of the NAND circuit 145. An "L"-level signal SUSPENDH is input to the other input terminal of the NAND circuit 145. The NAND circuit 145 performs a NAND operation, and transmits an "H"-level signal to the gate of the transistor 141 as the operation result. Since the signal received from the NAND circuit 145 is at the "H" level, the transistor 141 is turned on. As a result, the potential of the node N5 is brought to the "L" level. Accordingly, the inverter circuit 143 receives an "L"-level signal. The inverter circuit 143 transmits an "H"-level signal obtained by inverting the logical level of the "L"-level signal to the inverter circuit 144. The inverter circuit 144 transmits an "L"-level signal ENH_N obtained by inverting the logical level of the "H"-level signal to the level shifter circuit 130.

Figure 11:
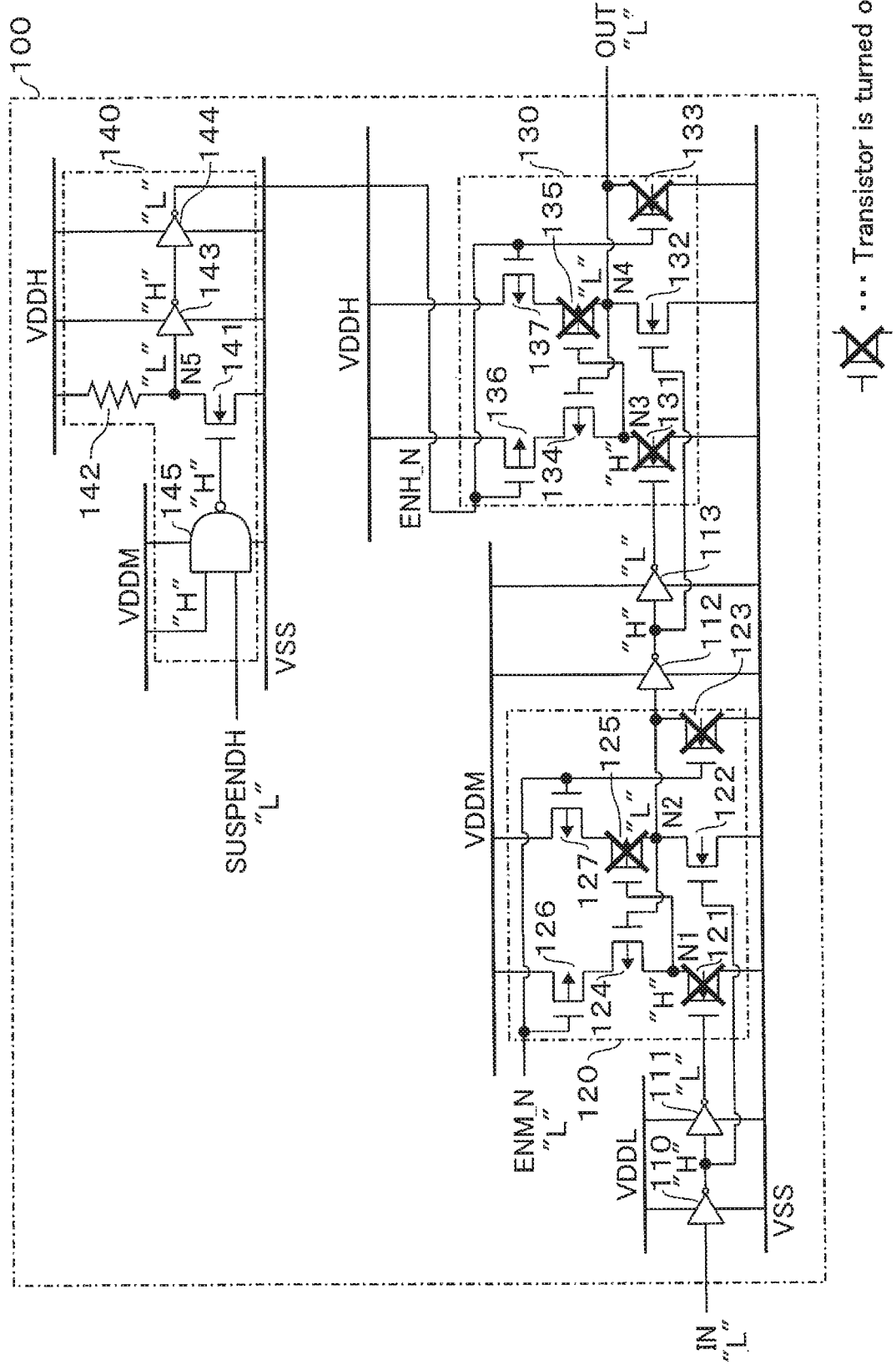
FIG. 11 is a diagram illustrating an operation of the I/O circuit included in the semiconductor device according to the second embodiment.

Next, the case where the voltage VDDM is active, the signal SUSPENDH is at the "L" level, and the input signal IN is at the "L" level will be described. FIG. 11 is a diagram illustrating the operation of the I/O circuit 100 when the voltage VDDM is active, the signal SUSPENDH is at the "L" level, and the input signal IN is at the "L" level. The operations other than that of the enabler circuit 140 are the same as those in the case of FIG. 7. The operation of the enabler circuit 140 is the same as that in the case of FIG. 10.

Next, the case where the voltage VDDM is inactive (such as the voltage VSS) and the signal SUSPENDH is at the "L" level will be described. FIG. 12 is a diagram illustrating the operation of the I/O circuit 100 when the voltage VDDM is inactive and the signal SUSPENDH is at the "L" level. The operations other than that of the enabler circuit 140 are the same as those in the case of FIG. 8; therefore, the operation of the enabler circuit 140 will be described below.

As shown in FIG. 12, an inactive voltage VDDM, i.e., an "L"-level signal, is input to one input terminal of the NAND circuit 145. An "L"-level signal SUSPENDH is input to the other input terminal of the NAND circuit 145. Since the two inputs of the NAND circuits 145 are both at the "L" level, the operation result of the NAND circuit 145 is usually the "H" level; however, since the voltage VDDM coupled to the NAND circuit 145 is inactive, the output of the NAND circuit 145 is at the "L" level. The output of the NAND circuit 145 is at the "H" level immediately after the voltage VDDM changes from the active state to the inactive state; however, since the voltage VDDM gradually falls under the influence of the leak current, the output of the NAND circuit 145 finally reaches the "L" level. Since the signal received from the NAND circuit 145 is at the "L" level, the transistor 141 is turned off. As a result, the potential of the node N5 is brought to the "H" level. Accordingly, the inverter circuit 143 receives an "H"-level signal. The inverter circuit 143 transmits an "L"-level signal obtained by inverting the logical level of the "H"-level signal to the inverter circuit 144. The inverter circuit 144 transmits an "H"-level signal ENH_N obtained by inverting the logical level of the "L"-level signal to the level shifter circuit 130.

Next, the case where the level shifter circuit 130 outputs an "L"-level signal regardless of the input signal IN will be described.

Figure 13:
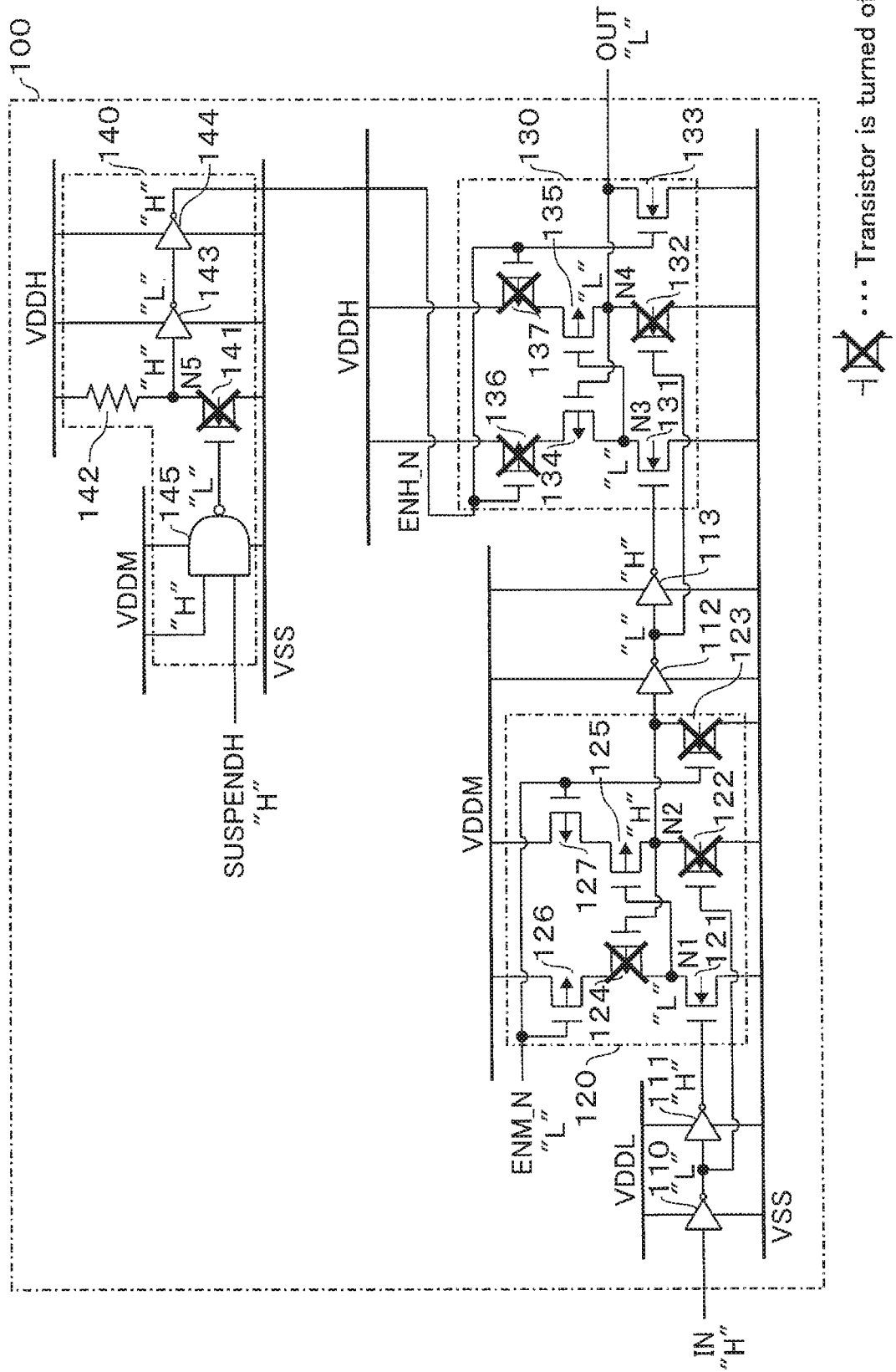
FIG. 13 is a diagram illustrating an operation of the I/O circuit included in the semiconductor device according to the second embodiment.

First, the case where the voltage VDDM is active, the signal SUSPENDH is at the "H" level, and the input signal IN is at the "H" level will be described. FIG. 13 is a diagram illustrating the operation of the I/O circuit 100 when the voltage VDDM is active, the signal SUSPENDH is at the "H" level, and the input signal IN is at the "H" level. The operations other than those of the level shifter circuit 130 and the enabler circuit 140 are the same as those in the case of FIG. 6; therefore, the operations of the level shifter circuit 130 and the enabler circuit 140 will be described below.

As shown in FIG. 13, an active voltage VDDM, i.e., an "H"-level signal, is input to one input terminal of the NAND circuit 145. An "H"-level signal SUSPENDH is input to the other input terminal of the NAND circuit 145. The NAND circuit 145 performs a NAND operation, and transmits an "L"-level signal to the gate of the transistor 141 as the operation result. Since the signal received from the NAND circuit 145 is at the "L" level, the transistor 141 is turned off. As a result, the potential of the node N5 is brought to the "H" level. Accordingly, the inverter circuit 143 receives an "H"-level signal. The inverter circuit 143 transmits an "L"-level signal obtained by inverting the logical level of the "H"-level signal to the inverter circuit 144. The inverter circuit 144 transmits an "H"-level signal ENH_N obtained by inverting the logical level of the "L"-level signal to the level shifter circuit 130.

The "H"-level signal received from the inverter circuit 113 is input to the gate of the transistor 131. Since the signal received from the inverter circuit 113 is at the "H" level, the transistor 131 is turned on. The "L"-level signal received from the inverter circuit 112 is input to the gate of the transistor 132. Since the signal received from the inverter circuit 112 is at the "L" level, the transistor 132 is turned off. The "H"-level signal ENH_N received from the enabler circuit 140 is input to each of the gates of the transistors 133, 136, and 137 of the level shifter circuit 130. Since the signal ENH_N is at the "H" level, the transistor 133 is turned on, whereas the transistors 136 and 137 are turned off. Since the transistor 133 is ON, the potential of the node N4 is brought to the "L" level. Accordingly, the level shifter circuit 130 outputs an "L"-level signal as the output signal OUT.

Figure 14:
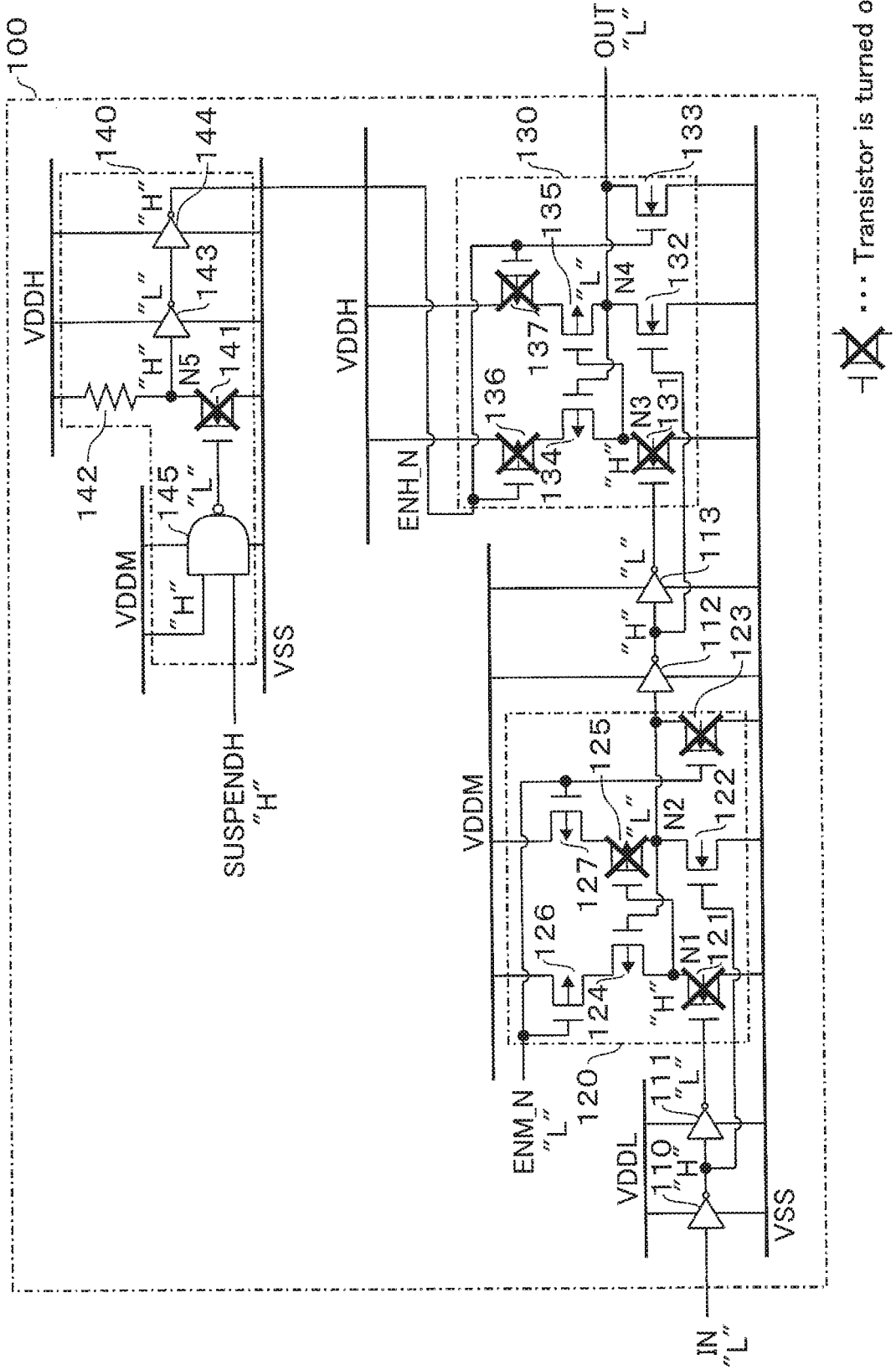
FIG. 14 is a diagram illustrating an operation of the I/O circuit included in the semiconductor device according to the second embodiment.

Next, the case where the voltage VDDM is active, the signal SUSPENDH is at the "H" level, and the input signal IN is at the "L" level will be described. FIG. 14 is a diagram illustrating the operation of the I/O circuit 100 when the voltage VDDM is active, the signal SUSPENDH is at the "H" level, and the input signal IN is at the "L" level. The operations other than those of the level shifter circuit 130 and the enabler circuit 140 are the same as those in the case of FIG. 7 and the operation of the enabler circuit 140 is the same as that in the case of FIG. 13; therefore, the operation of the level shifter circuit 130 will be described below.

As shown in FIG. 14, the "L"-level signal received from the inverter circuit 113 is input to the gate of the transistor 131. Since the signal received from the inverter circuit 113 is at the "L" level, the transistor 131 is turned off. The "H"-level signal received from the inverter circuit 112 is input to the gate of the transistor 132. Since the signal received from the inverter circuit 112 is at the "H" level, the transistor 132 is turned on. The "H"-level signal ENH_N received from the enabler circuit 140 is input to each of the gates of the transistors 133, 136, and 137 of the level shifter circuit 130. Since the signal ENH_N is at the "H" level, the transistor 133 is turned on, whereas the transistors 136 and 137 are turned off. Since the transistor 133 is ON, the potential of the node N4 is brought to the "L" level. Accordingly, the level shifter circuit 130 outputs an "L"-level signal as the output signal OUT.

Figure 15:
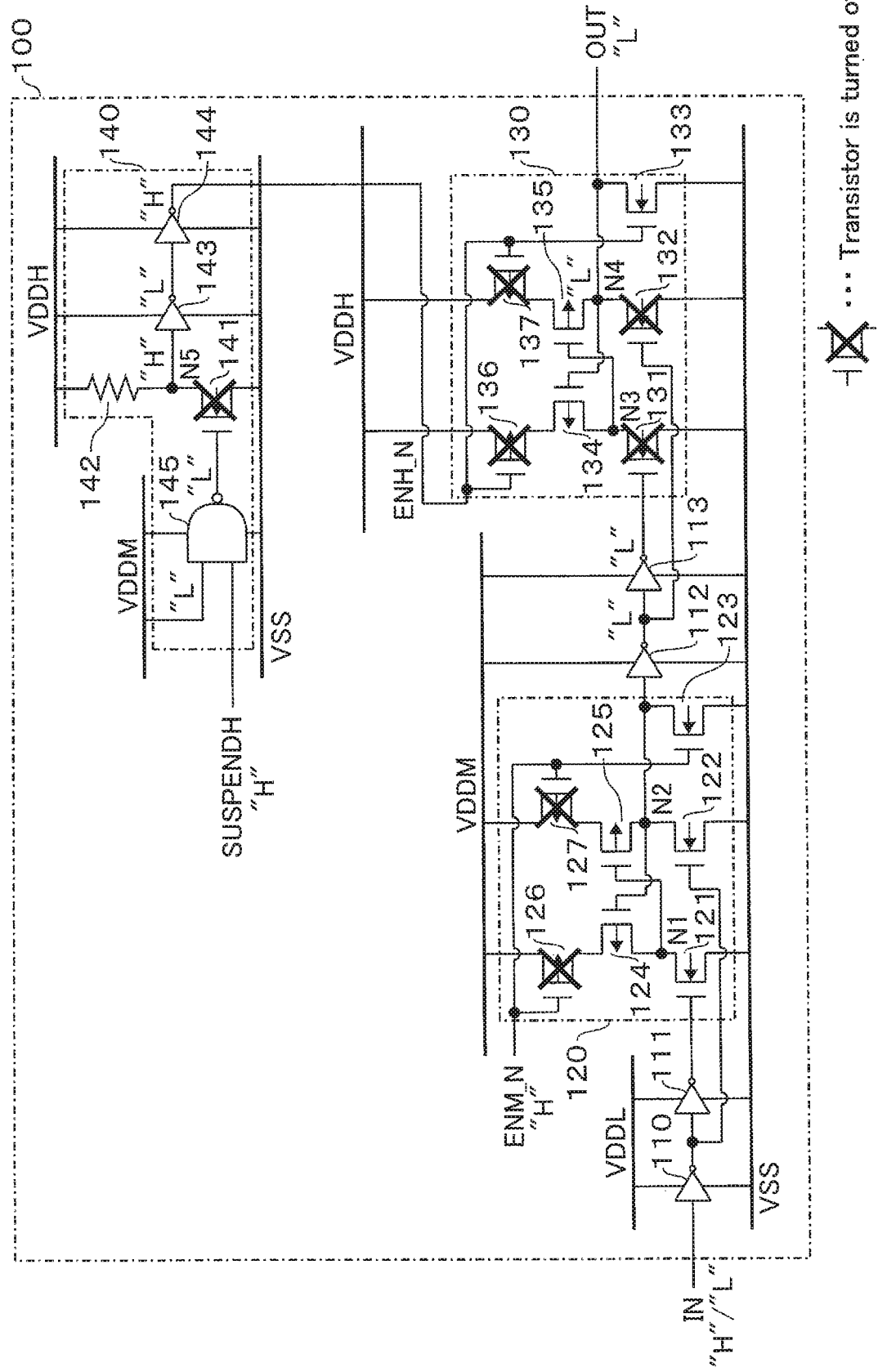
FIG. 15 is a diagram illustrating an operation of the I/O circuit included in the semiconductor device according to the second embodiment.

Next, the case where the voltage VDDM is inactive (such as the voltage VSS) and the signal SUSPENDH is at the "H" level will be described. FIG. 15 is a diagram illustrating the operation of the I/O circuit 100 when the voltage VDDM is inactive and the signal SUSPENDH is at the "H" level. The operations other than that of the enabler circuit 140 are the same as those in the case of FIG. 8; therefore, the operation of the enabler circuit 140 will be described below.

As shown in FIG. 15, an inactive voltage VDDM, i.e., an "L"-level signal, is input to one input terminal of the NAND circuit 145. An "H"-level signal SUSPENDH is input to the other input terminal of the NAND circuit 145. Since the two inputs of the NAND circuits 145 are respectively at the "L" level and "H" level, the operation result of the NAND circuit 145 is usually the "H" level; however, since the voltage VDDM coupled to the NAND circuit 145 is inactive, the output of the NAND circuit 145 is at the "L" level. The output of the NAND circuit 145 is at the "H" level immediately after the voltage VDDM changes from the active state to the inactive state; however, since the voltage VDDM gradually falls under the influence of the leak current, the output of the NAND circuit 145 finally reaches the "L" level. Since the signal received from the NAND circuit 145 is at the "L" level, the transistor 141 is turned off. As a result, the potential of the node N5 is brought to the "H" level. Accordingly, the inverter circuit 143 receives an "H"-level signal. The inverter circuit 143 transmits an "L"-level signal obtained by inverting the logical level of the "H"-level signal to the inverter circuit 144. The inverter circuit 144 transmits an "H"-level signal ENH_N obtained by inverting the logical level of the "L"-level signal to the level shifter circuit 130.

2.3 Advantageous Effects of Present Embodiment

As in the first embodiment, the configuration according to the present embodiment prevents the output signal OUT of the level shifter circuit 130 from becoming inconstant. In addition, the above configuration enables the SOC 1 to suppress the flow-through leak current at the level shifter circuit 130 as in the first embodiment. Moreover, the above configuration enables the NAND circuit 145 to output an "L"-level signal when the voltage VDDM is active and the signal SUSPENDH is at the "H" level. This enables the SOC 1 to suppress the regular leak current from the voltage VDDH to the ground voltage VSS at the enabler circuit 140.

3. Modifications, Etc.

As described above, the semiconductor devices according to the embodiments include an I/O circuit (100) configured to be supplied with a first voltage (VDDL), a second voltage (VDDM) higher than the first voltage, and a third voltage (VDDH) higher than the second voltage, and to receive an input signal (IN) based on the first voltage. The I/O circuit includes an enabler circuit (140) configured to be supplied with the second voltage, and to generate a first signal (ENH_N) based on the second voltage, and a first level shifter circuit (130) coupled to the enabler circuit, and configured to, based on the first signal, level-shift a signal based on the second voltage to a signal based on the third voltage.

The embodiments are not limited to the above-described ones, and various modifications are possible.

The enabler circuit 140 is not limited to the circuits described in the above embodiments, and may be any circuit as long as it can generate a signal ENH_N based on the state of the voltage VDDM.

Also, the signal ENM_N may be generated in the I/O circuit 100. For example, the I/O circuit 100 may include an enabler circuit, and the enabler circuit may generate a signal ENM_N, whereas the level shifter circuit 120 may receive the signal ENM_N from the enabler circuit. This enabler circuit may have the same configuration as the enabler circuit 140, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
an I/O circuit configured to be supplied with a first voltage, a second voltage higher than the first voltage, and a third voltage higher than the second voltage, and to receive an input signal based on the first voltage,
wherein the I/O circuit comprises:
an enabler circuit configured to be supplied with the second voltage, and to generate a first signal based on the second voltage; and
a first level shifter circuit coupled to the enabler circuit, and configured to, based on the first signal, level-shift a signal based on the second voltage to a signal based on the third voltage,
the enabler circuit comprises:
a transistor;
a resistance element:
a first inverter circuit; and
a second inverter circuit,
wherein the second voltage is applied to a gate of the transistor,
a ground voltage is applied to a source of the transistor,
a drain of the transistor is coupled to one end of the resistance element and an input terminal of the first inverter circuit,
the third voltage is applied to another end of the resistance element,
an output terminal of the first inverter circuit is coupled to an input terminal of the second inverter circuit, and
an output terminal of the second inverter circuit is coupled to the first level shifter circuit.

2. The device according to claim 1, wherein when the second voltage is active, the first signal is at a first logical level, and the signal based on the third voltage is at a same logical level as the input signal.

3. The device according to claim 2, wherein when the second voltage is inactive, the first signal is at a second logical level different from the first logical level, and the signal based on the third voltage is at a third logical level.

4. The device according to claim 1, wherein the I/O circuit further comprises a second level shifter circuit configured to, based on a second signal, level-shift the input signal to the signal based on the second voltage, and to transmit the level-shifted signal to the first level shifter circuit.

5. The device according to claim 4, wherein the second level shifter circuit receives the second signal from outside the I/O circuit.

6. A semiconductor device comprising:
an I/O circuit configured to be supplied with a first voltage, a second voltage higher than the first voltage, and a third voltage higher than the second voltage, and to receive an input signal based on the first voltage,
wherein the I/O circuit comprises:

an enabler circuit configured to be supplied with the second voltage, and to generate a first signal based on the second voltage and a second signal; and a first level shifter circuit coupled to the enabler circuit, and configured to, based on the first signal, level-shift a signal based on the second voltage to a signal based on the third voltage, the enabler circuit comprises:

a NAND circuit;

a transistor;

a resistance element;

a first inverter circuit; and a second inverter circuit, wherein the second voltage is applied to one input terminal of the NAND circuit, the second signal is input to another input terminal of the NAND circuit, a gate of the transistor is coupled to an output terminal of the NAND circuit, a ground voltage is applied to a source of the transistor, a drain of the transistor is coupled to one end of the resistance element and an input terminal of the first inverter circuit, the third voltage is applied to another end of the resistance element, an output terminal of the first inverter circuit is coupled to an input terminal of the second inverter circuit, and an output terminal of the second inverter circuit is coupled to the first level shifter circuit.

7. The device according to claim 6, wherein when the second voltage is active and the second signal is at a first logical level, the first signal is at a second logical level, and the signal based on the third voltage is at a same logical level as the input signal.

8. The device according to claim 7, wherein when the second voltage is inactive and the second signal is at the first logical level, the first signal is at a third logical level different from the second logical level, and the signal based on the third voltage is at a fourth logical level.

9. The device according to claim 7, wherein when the second signal is at a fifth logical level different from the first logical level, the first signal is at a sixth logical level different from the second logical level, and the signal based on the third voltage is at a seventh logical level.

10. The device according to claim 6, wherein the I/O circuit further comprises a second level shifter circuit configured to, based on a third signal, level-shift the input signal to the signal based on the second voltage, and to transmit the level-shifted signal to the first level shifter circuit.

11. The device according to claim 10, wherein the second level shifter circuit receives the third signal from outside the I/O circuit.

* * * * *